(12) United States Patent
Duong et al.

(10) Patent No.: US 10,208,940 B2
(45) Date of Patent: Feb. 19, 2019

(54) SYSTEMS AND METHODS FOR COUPLING A METAL CORE PCB TO A HEAT SINK

(71) Applicant: Fluence Bioengineering, Austin, TX (US)

(72) Inventors: Dung Duong, Austin, TX (US); Randall Johnson, Austin, TX (US); Nicholas Klase, Austin, TX (US)

(73) Assignee: Fluence Bioengineering, Inc., Austin, TX (US)

( * ) Notice: Subject to any disclaimer, the term of this patent is extended or adjusted under 35 U.S.C. 154(b) by 0 days.

(21) Appl. No.: 15/678,880

(22) Filed: Aug. 16, 2017

(65) Prior Publication Data

US 2018/0320876 A1 Nov. 8, 2018

Related U.S. Application Data

(60) Provisional application No. 62/500,945, filed on May 3, 2017.

(51) Int. Cl.
| | |
|---|---|
| *F21V 29/00* | (2015.01) |
| *F21V 29/502* | (2015.01) |
| *H05K 7/20* | (2006.01) |
| *H05K 1/02* | (2006.01) |
| *F28F 3/02* | (2006.01) |
| *H01L 23/367* | (2006.01) |

(52) U.S. Cl.
CPC ............. *F21V 29/502* (2015.01); *F28F 3/02* (2013.01); *H01L 23/367* (2013.01); *H05K 1/021* (2013.01); *H05K 7/20409* (2013.01)

(58) Field of Classification Search
USPC ........................................ 362/218, 373, 547
See application file for complete search history.

(56) References Cited

U.S. PATENT DOCUMENTS

| | | | |
|---|---|---|---|
| 2010/0020170 A1* | 1/2010 | Higgins-Luthman | ........................ B60Q 1/1423 348/135 |
| 2010/0172542 A1* | 7/2010 | Stein | .................. G06K 9/00798 382/103 |
| 2011/0074956 A1* | 3/2011 | Faber | ..................... G02B 23/12 348/148 |
| 2012/0105639 A1* | 5/2012 | Stein | ...................... H04N 5/235 348/148 |
| 2013/0088871 A1* | 4/2013 | Yun | ......................... F21V 5/007 362/249.01 |
| 2013/0294068 A1* | 11/2013 | Kuenzler | ................ F21V 7/048 362/234 |
| 2013/0294072 A1* | 11/2013 | Miller | ....................... F21V 7/00 362/235 |
| 2014/0207344 A1* | 7/2014 | Ihlenburg | ................ E05F 15/73 701/49 |

(Continued)

*Primary Examiner* — Tuyen K Vo
(74) *Attorney, Agent, or Firm* — Pierson IP, PLLC

(57) ABSTRACT

Embodiments may utilize a series of exposed fins, which increase the surface area of the heat sink creating additional air flow. As hotter air rises within the system, cooler is drawn into the heatsink. The fins may be exposed on both sides of the longitudinal axis, allowing cooler air to be drawn towards the longitudinal axis above the heatsink and flow upward. This process may cool the fins. Additionally, the spacing between the fins may have to be wide enough to allow for air to freely enter the heatsink.

12 Claims, 5 Drawing Sheets

(56) References Cited

U.S. PATENT DOCUMENTS

2014/0328065 A1* 11/2014 Barnetson ................ F21K 9/13
                                                    362/249.06
2017/0352605 A1* 12/2017 Bilan .................. H01L 23/3672

* cited by examiner

SYSTEMS AND METHODS FOR COUPLING A METAL CORE PCB TO A HEAT SINK

CROSS-REFERENCE TO RELATED APPLICATIONS

This application claims a benefit of priority under 35 U.S.C. § 119 to Provisional Application No. 62/500,945 filed on May 3, 2017, which is fully incorporated herein by reference in their entirety.

BACKGROUND INFORMATION

Field of the Disclosure

Examples of the present disclosure are related to systems and methods for coupling a metal core PCB (MCPCB) to a heat sink. More particularly, embodiments disclose a positioning a MCPCB as a based below a heat sink control dissipated heat caused by a light fixture, wherein the heat sink includes exposed fins that allow for additional air flow.

Background

Greenhouses are buildings or complexes in which plants are grown. For various reasons including price, it is typically ideal for greenhouses to operate with as much natural sunlight as possible. To supplement natural light from the sun, high powered lights are used within greenhouses when the sun or other natural light does not provide enough light for optimal plant growth.

However, the operation of the high powered lights is more costly than utilizing free sunlight. More so, conventional high powered lights are larger in size, which blocks the incoming free sunlight. Furthermore, the blocking of the incoming sunlight causes shading on the plants within the greenhouse, which negatively impacts the grower's productivity.

Although light emitting diodes (LEDs) are more efficient than traditional high powered lights, their manufacturing costs are higher. Additionally, the LEDs cause excessive shading based on requiring larger fixtures to dissipate heat. To circumvent the large fixtures required to dissipate the heat, some manufacturers have attempted to build smaller LED fixtures that use active cooling fans. However, in greenhouse environments, active cooling fans quickly clog with dirt, bugs, etc. This causes the LED fixtures with active cooling fans to quickly become inoperable.

Conventional LED fixtures that do not include active cooling fans use traditional linear heat sinks. However, traditional linear heat sinks include wings that extend in a direction parallel with a central axis of the conventional LED fixtures. Heat generated through conventional LED fixtures may dissipate based on convection, conduction or radiation. However, due to LED fixtures being suspended, there is minimal heat dissipation via conduction. Radiation is a function of the fixture temperature and may be significant, and convection is the primary method to dissipate heat. In applications, air particles remove heat from the fixture through air movement. For longer heat sinks, air movement within the middle of the fixtures is minimal. This severely limits the amount of power conventional LED fixtures can consume because additional power consumption leads to more heat.

Accordingly, needs exist for more effective and efficient systems and methods for heat sinks with MCPCB bases positioned below exposed fins that allow additional air flow.

SUMMARY

Embodiments disclosed herein describe systems and methods for heat sinks with MCPCB bases within light fixtures. In embodiments, a heat sink may be a passive system that continually and passively creates a cross-flow thermal management system dissipating large amounts of heat in a slim light fixture.

Embodiments may utilize a series of exposed fins that increase the surface area of the heat sink creating additional air flow. As hotter air rises within the system, cooler air is drawn into the heatsink. The fins may have exposed sides, a partially exposed lower surface, and an exposed upper surface, allowing cooler air to be drawn towards the longitudinal axis above the light source and flow upward. This process may cool the fins. Additionally, the spacing between the fins may be wide enough to allow for air to freely enter the heatsink.

Embodiments may include a folded fin. The folded fin may be comprised of sheet metal that is folded over itself multiple times at even intervals from a first end of the longitudinal axis to a second end of the longitudinal axis. By folding the fin over itself, the heatsink may be formed having alternating closed and opened adjacent upper and lower surfaces. Embodiments may include systems having side extrusions to create the plurality of fins from an aluminum block. Embodiments may include extruded aluminum to create the plurality of fins, wherein a rib is formed along the longitudinal axis of the heat sink. The extrusions and/or rib may be textured and/or contoured in the heat flow direction. This may increase the surface area of the fins and rib exposed in the heat flow direction, allowing for a more efficient system.

Embodiments may include a MCPCB base that is directly attached to a folded fin or extrusion. This may allow for lower thermal resistance from heat sources to the fins, while also having less interfaces and/or coupling points. This may lead to a lower probability of air bubbles. The MCPCB base may include vents that are configured to allow increased air flow through the system.

Additionally, the MCPCB base may not cover the entirety of a lower surface of the extruded fins. This may allow for more surface area of the fins to be exposed to manage heat flow. The MCPCB base may include angled overhangs that project away from the longitudinal axis of the base at a downward angle, further exposing the lower surfaces of the fins.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
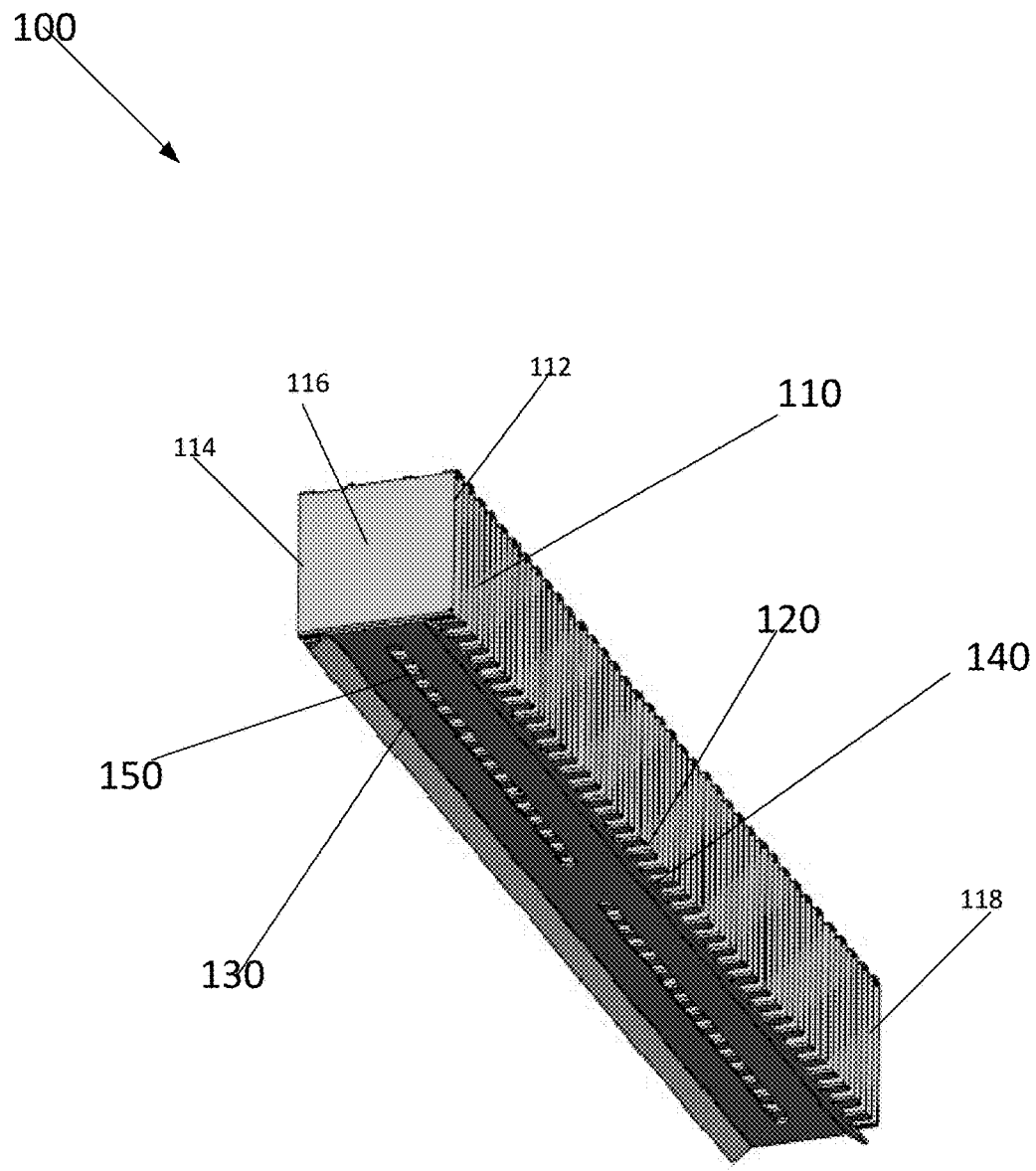
FIG. 1 depicts a cross flow heat sink, according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

Embodiments may utilize a MCPCB base positioned below series of exposed fins, to allow for and control additional air flow. The fins may be exposed on both side edges and portions of the lower surfaces of the fins, allowing cooler air to be drawn internally towards a longitudinal axis of the heatsink, above the heat source, and flow upward. This process may cool the fins. Additionally, the spacing between the fins may be wide enough to allow for air to freely enter the heatsink via the sides of the fins and/or through exposed lower surfaces of the fins.

FIG. 1 depicts a cross flow heat sink 100, according to an embodiment. Cross flow heat sink 100 may be configured to dissipate heat from a heat source, such as a light fixture, wherein the light fixture may be positioned under heat sink 100. In a conventional linear heat sink, the heat generated from the heat source flows around the heat sink. In cross flow heat sink 100, the generated heat may be configured to flow through fins 110 in spaces between fins 110. This may more rapidly and efficiently dissipate the generated heat. Heat sink 100 may include fins 110 and base 130.

Fins 110 may be comprised of a unitary, folded sheet of metal, such as aluminum. The sheet of metal may be folded over itself from a first end of heat sink 100 to a second end of heat sink 100 to create folded fins 110. By folding the sheet over itself, alternating fins 110 may have a closed upper surface followed by an open upper surface. In embodiments, chambers may be formed between the alternating fins 110, wherein air may enter into chambers via open lower ends and/or open sidewalls of the chambers. Air may flow out of the chambers via openings in the upper surfaces of the chambers and/or the open sidewalls of the chambers.

The closed upper and lower surfaces of fins 110 may restrict the flow of air into and out of heat sink 100. To increase the flow of air into and out of heat sink 100, portions of the upper ends of first chambers may be cut to form flat planar upper surfaces of first chambers. A cut planar surface may expose more of the upper surfaces of fins 110, which may allow for more effective heat flow. However, portions of the closed upper surfaces may not be cut to maintain physical contact between the first chambers and the second chambers 150.

By maintaining contact between adjacent fins 110 via the non-cut portions of the upper surfaces and the closed lower surfaces, heat sink 100 may have sufficient strength along the central axis of heat sink 100.

A MCPCB base 130 may be directly attached to a folded fin 110 or extrusion. This may allow for lower thermal resistance from heat sources to the fins, while also having less interfaces and/or coupling points. This may lead to a lower probability of air bubbles. The MCPCB base 130 may include vents that are configured to allow increased air flow through the system. The MCPCB base 130 may not cover the entirety of a lower surface of the fins 110. This may allow for more surface area of the fins to be exposed to manage heat flow. The MCPCB base 130 may include angled overhangs that project away from the longitudinal axis of the base at a downward angle, further exposing the lower surfaces of the fins. Base 130 may be coupled to a lower surface of fins 110 via adhesives, thermal bonding, welding, coupling mechanisms, etc. Base 130 may have a shorter width than that of fins 110, and not extend across the entire width of heat sink 300. Accordingly, the outer portions 120 of the lower surfaces of fins 120 may be exposed and not covered by base 130. This may allow hot air to enter heat sink 100 without traveling to the outer edges of fins 110. However, in other embodiments, base 130 may extend across the entire lower surfaces of fins 110, which may include or not include protrusions 140.

Protrusions 140 may be positioned at the outer edges of base 130. Protrusions 140 may be projections extending away from the outer edges of base 130. The protrusions 140 may be formed by bending the base in a direction that is in parallel to a longitudinal axis of base 130, wherein the bends are offset from the central axis of the base. In embodiments, protrusions 140 may project at a downward angle. By positioning protrusions 140 at a downward angle on the outer edges of base 130, lower portions 120 of fins 110 may be exposed, wherein a vertical offset from between the protrusions 140 and the lower portions 120 of fins 110 increases towards the outer edges 112, 114 of fins 110. Furthermore, the vertical offset between the outer edges of protrusions and the lower portions 120 of find 110 may be based on a length of heat sink 100, wherein longer heat sinks 100 require a greater vertical offset. By exposing lower portions 120 of fins 110 via angled protrusions 140, heated air may be guided into the heat sink 100 via the lower, exposed portions 120. In embodiments, the outer edges of protrusions 140 may be positioned between the outer edges of base 130 and the outer edges 112, 114 of fins 110. In other words, the outer edges of protrusions 140 may not extend past the outer edges 112, 114 of fins 110. In embodiments, the angled protrusions 140 may extend past the edges of fins 110, extend to a position that is aligned with the edges of fins 110, or extend to a position that is before the edges of fins 110.

Orifices 150 may be holes, openings, gaps, etc. positioned through base 130, which may extend through the height of base 130. Orifices 150 may be configured to allow heated air to flow from a positioned below base 130 directly into heat sink 100. Orifices 150 may be positioned at various positions along base 130. For example, orifices 150 may be configured to align with a central axis of heat sink 100. By positioning orifices 150 directly below the central axis of heat sink 100, air may flow directly into the middle of fins 110. However, in different embodiments, orifices 515 may be positioned at different placements directly below fins 110. For example, orifices 150 may be positioned on both or a single side of the central axis of heat sink 100. Additionally, in embodiments, orifices 150 may be spaced apart from each other, such that there is not a continuous opening from the first end 116 to the second end 118 of heat sink.

Figure 2:
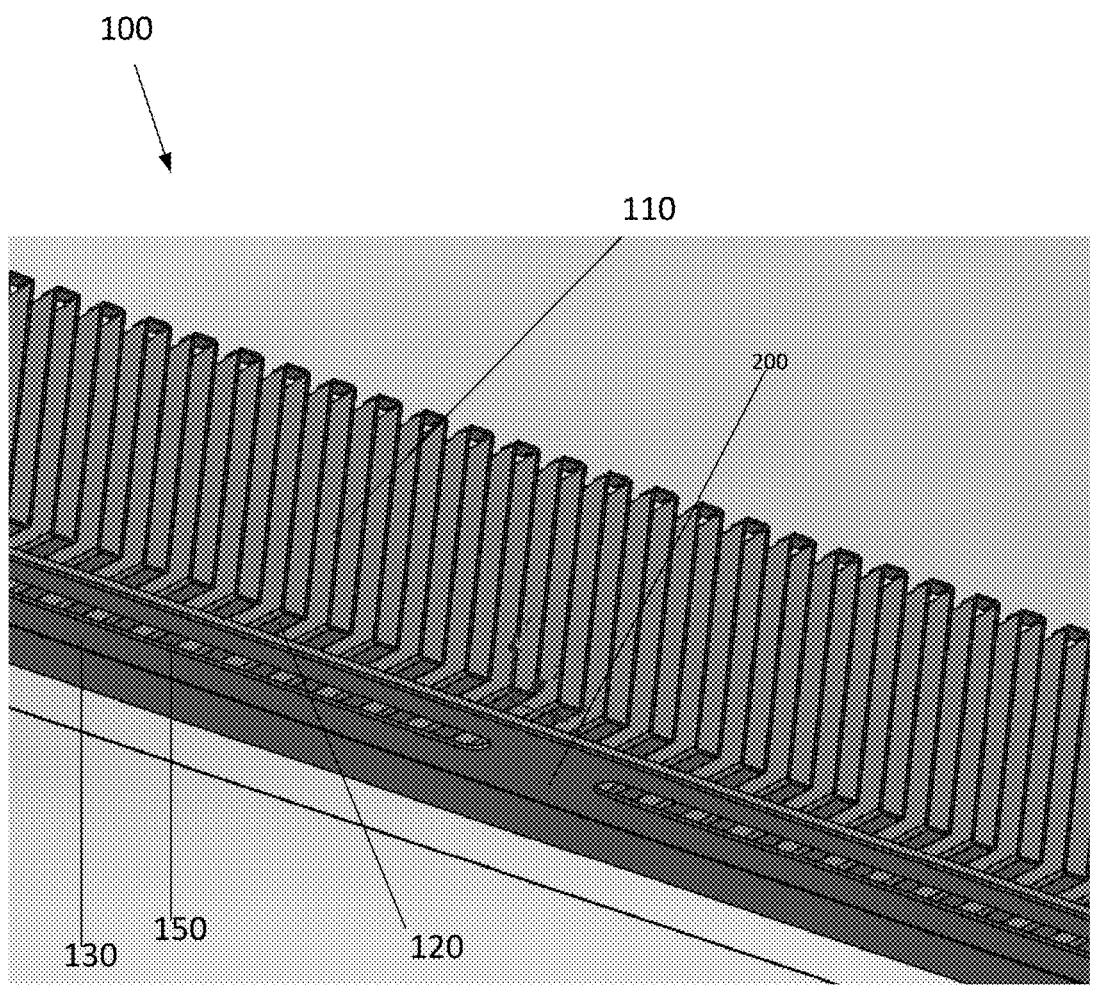
FIG. 2 depicts a cross flow heat sink system, according to an embodiment

FIG. 2 depicts a cross flow heat sink system 100, according to an embodiment. Elements depicted in FIG. 2 may be described above. For the sake of brevity, an additional description of these elements is omitted.

As depicted in FIG. 2, base 130 may be positioned directly adjacent to the lower surfaces of fins 110. Further, orifices 150 are configured to expose portions of the lower surfaces of fins 110 that are aligned with the central axis of heat sink 100. However, other portions of the lower surface of fins 110 aligned with the central axis of heat sink 100 may remain covered by coupling portions 200 of base 130. The coupling portions 200 of base 130 may be utilized to couple portions of base 130 along the central axis of heat sink 100 with fins 110. This may allow for additional rigidity and strength of heat sink 100.

Figure 3:
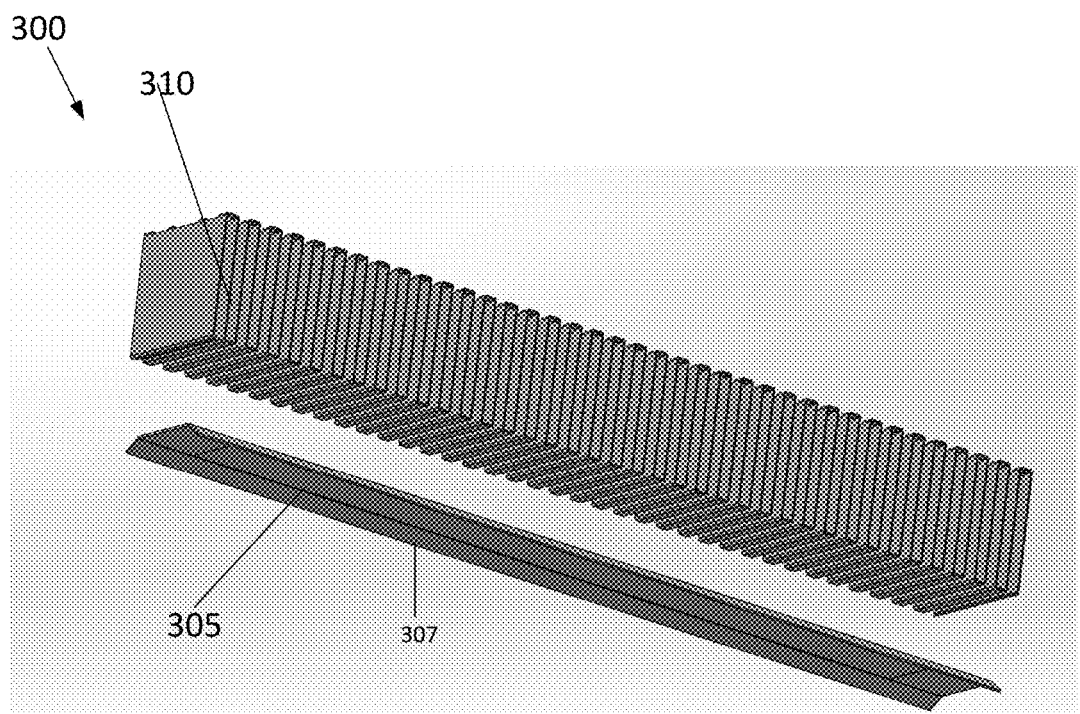
FIGS. 3 and 4 depict a base being coupled with fins formed of folded sheet metal, according to an embodiment.
Figure 4:
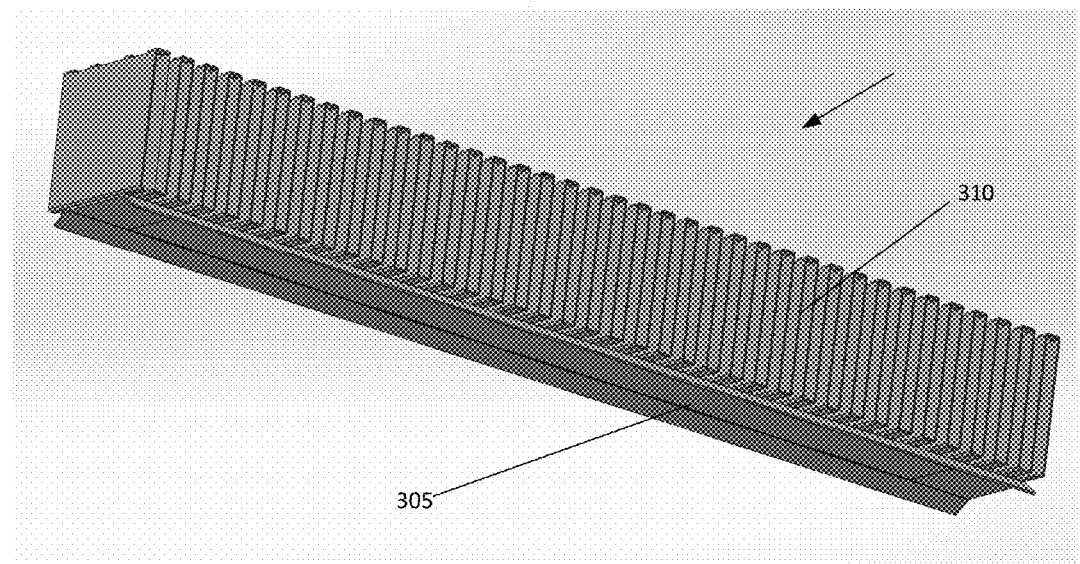

FIGS. 3 and 4 depict embodiments of a base being coupled with fins formed of folded sheet metal. Elements depicted in the FIGURES may be described above. For the sake of brevity, an additional description of these elements is omitted.

As depicted in FIGS. 3 and 4, a base 305 may be directly attached to the lower surfaces of fins 310. Base 305 may be comprised of MCPCB, which may be bent for rigidity. Base 305 may also have angled, tapered, tec. Protrusions 307 to allow for lower surfaces of fins 310 to be exposed creating less thermal resistance from heats sources to fins 310. Furthermore, base 305 may be created without protrusions, and create a planar continuous surface between the front end and rear end of heat sink 300. This may allow for more coupling points between base 305 and fins 310.

Figure 5:
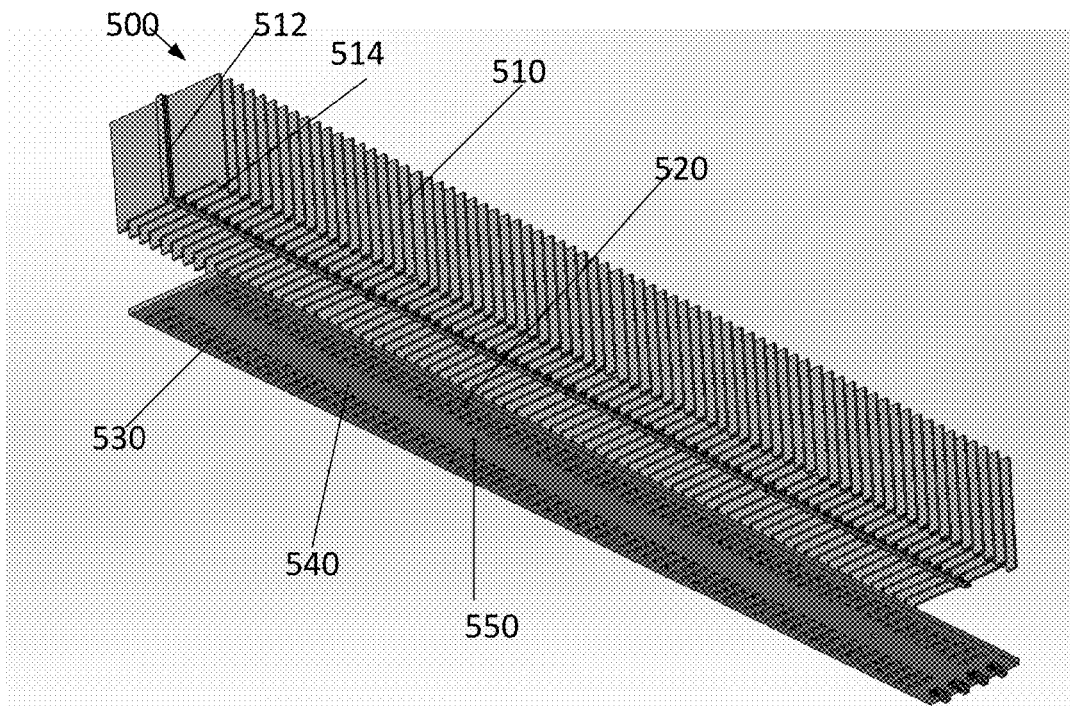
FIGS. 5 and 6 depict a heat sink, according to an embodiment.
Figure 6:
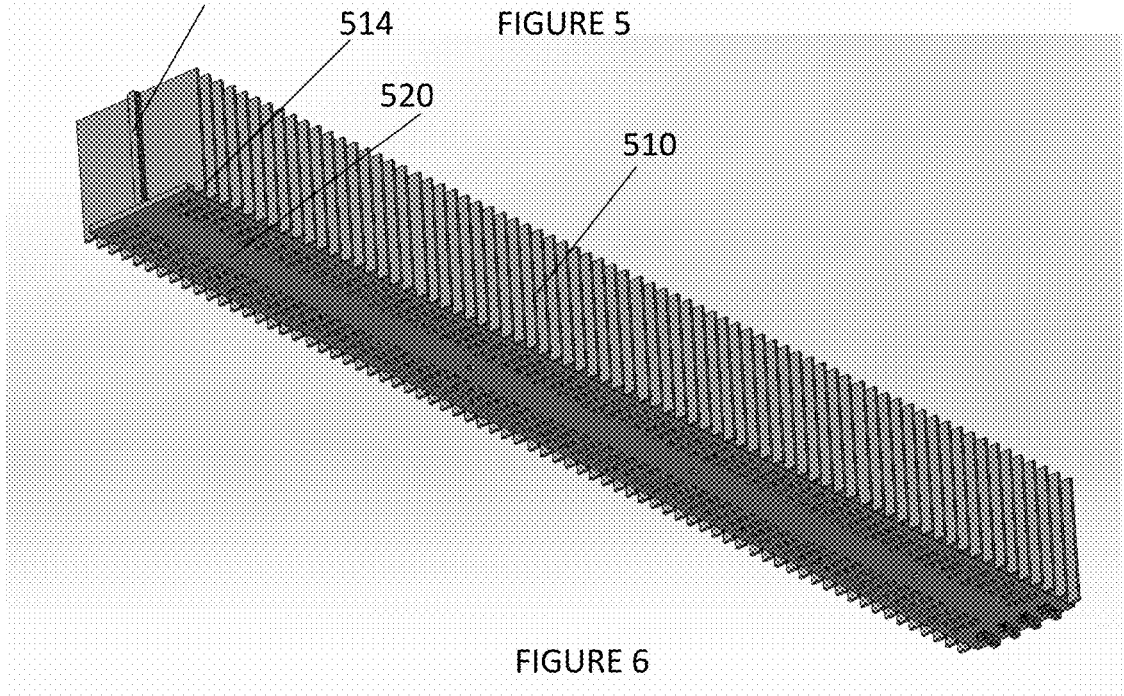

FIGS. 5 and 6 depict a heat sink 500, according to an embodiment. Elements depicted in the FIGS. 5 and 6 may be described above. For the sake of brevity, an additional description of these elements is omitted.

As depicted in FIGS. 5 and 6, fins 510 may be formed by extruding portions of a unitary block of metal. The uncut parts may form fins 510, a rib 512, and overhangs 514.

Fins 510 may be formed on both sides of the rib 512, and may have three exposed edges. A fourth edge of fins 510 may be the internal edge of fins 510 within heat sink 500, which may be covered by rib 512. Heated air may be configured to flow into and out of heat sink 500 via the openings between fins 510.

Rib 520 may be formed by extruding portions of the unitary block of metal. Rib 520 may be configured to extend from a front end to a back end of heat sink 500, and may have a height that is substantially equal to the portions of fins 510 without overhangs 514. Accordingly, the outer portions of fins 510 may have a greater height than that of rib 520.

Overhangs 514 may be created by not cutting the outermost portions of the lower surfaces of fins 510. As such a first overhang 514 may be created on a first side of a fin 510, and a second overhang 514 may be created on a second side of fin 510. Additionally, by extruding portions of the lower surfaces of fins 510, a cutout or contoured lower surface may be formed between the overhangs 514 between a first side and second side of fins 510. This may cause a height of portions of the fins with overhangs 514 to be greater than a height of portions of fins 510 without overhangs 514.

Base 520 may be a planar device that is configured to be positioned within the countered lower surface between overhangs 514. Base 520 may have a length that is substantially similar to that of heat sink 500, and have a width that is substantially similar to that of the countered lower surface of fins between overhangs 514. In embodiments, the lower surface of fin 510 may be configured to be positioned adjacent to the upper surface of base 520, and the outer edges of base 520 may be configured to be positioned adjacent to the inner surfaces of overhangs 514. Base may include a plurality of vent orifices 530, planar surface 540, and coupling orifices 550.

Vent orifices 530 may be orifices, holes, openings, etc. extending through the height of base 520. Vent orifices 530 positioned from a front end of heat sink 500 to a rear end of heat sink 500. Additionally, vent orifices 530 may be positioned on the sides of the central axis of heat sink 500 in a uniform pattern. However, in other embodiments, vent orifices 530 may be asymmetrically positioned. Vent orifices 530 may be positioned on the sides of the central axis of heat sink 500 to allow air to flow into the space between fins 510 on both sides of rib 512.

Planar surface 540 may be a substantially continuous planar surface that extends from the front end of heat sink 500 to the rear end of heat sink 500. Planar surface 540 may extend along the central axis of heat sink 500. Accordingly, planar surface 540 may be configured to align and be positioned adjacent to portions of rib 512. Planar surface 540 may include coupling orifices 550 that are configured to extend through planar surface 540 along the central axis if heat sink 500. In embodiments, coupling mechanisms, such as screws, may be configured to be inserted through the coupling orifices 550 and into rib 512 to couple base 520 with fins 510. Accordingly, base 520 may be directly affixed to fins 510.

The countered lower surface 1112 may have a width and a height that is substantially similar to that of a base 1120. Thus, the base 1120 may be inserted within the depression to form a surface that is flush with the sides of fins 1110.

As depicted in FIG. 6, responsive to coupling base 520 with fins 510, base 520 may be inserted into the contoured depression within the lower surface of fins 510.

Figure 7:
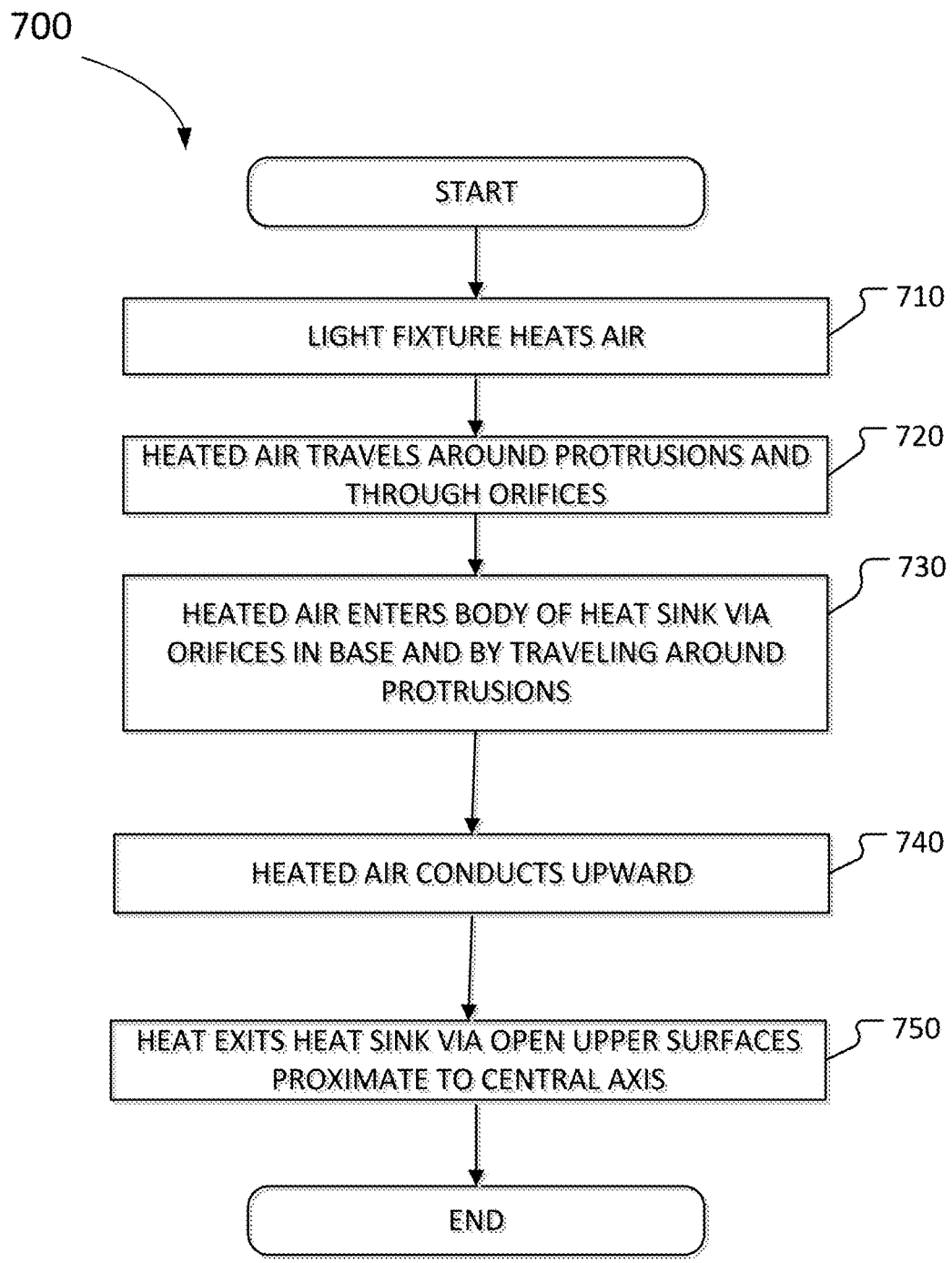
FIG. 7 illustrates a method for utilizing a heat sink, according to an embodiment.

FIG. 7 illustrates a method 700 for utilizing a heat sink, according to an embodiment. The operations of method 700 presented below are intended to be illustrative. In some embodiments, method 700 may be accomplished with one or more additional operations not described, and/or without one or more of the operations discussed. Additionally, the order in which the operations of method 700 are illustrated in FIG. 7 and described below is not intended to be limiting.

At operation 710, air below a heat sink may be heated by a light fixture positioned directly below the heat sink.

At operation 720, the heated air may travel upward and around protrusions of the heat sink. Additionally, the heated air may travel through orifices within the base At operation 730, the heated air may travel into the body of the heat sink via the orifices within the base, and by travelling around the protrusions.

At operation 740, the heated air may conduct upward and towards the central axis of the heat sink.

At operation 750, the heated air may exit the heat sink at a location proximate to the central axis of the heat sink.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

The flowcharts and block diagrams in the flow diagrams illustrate the architecture, functionality, and operation of possible implementations of systems, methods, and computer program products according to various embodiments of the present invention. In this regard, each block in the flowcharts or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

What is claimed is:

1. A heat sink for a light fixture comprising:
    a plurality of fins positioned from a first end of the heat sink to a second end of the heat sink, the plurality of fins being positioned perpendicular to a central axis of the heat sink;
    a base being coupled to lower surfaces of the plurality of fins, the base being comprised of metal core PCB, wherein the base does not cover an entirety of the lower surfaces of the plurality of fins;
    angled protrusions positioned on the sides of the base, the angled protrusions extending in a downward direction away from the lower surfaces of the plurality of fins to create a space between upper surfaces of the angled protrusions and the lower surfaces of the plurality of fins.

2. The heat sink of claim 1, wherein outer edges of the angled protrusions are positioned between the sides of the base and sides of the fins.

3. The heat sink of claim 1, wherein the lower surfaces of the fins are extruded to form a contoured depression between overhangs, the overhangs being positioned on edges of the fins.

4. The heat sink of claim 3, wherein the base is configured to be positioned between the overhangs.

5. The heat sink of claim 4, wherein the base includes a plurality of rows of vents orifices, the plurality of rows of vent orifices being offset from the central axis of the heat sink.

6. A method for creating a heat sink for a light fixture, the method comprising:
    coupling a base to lower surfaces of a plurality of fins, the plurality of fins being positioned from a first end of the heat sink to a second end of the heat sink, the plurality of fins having a fin width positioned perpendicular to a central axis of the heat sink, the base being comprised of metal core PCB, wherein the base does not cover an entirety of the lower surfaces of the plurality of fins;
    creating orifices extending through the base, the orifices having an orifice length extending in a direction from the first end of the heat sink towards the second end of the heat sink, the orifice length being greater than an orifice width, wherein the orifices expose the central axis of the heat sink;
    forming angled by bending the sides of the base along a direction in parallel with a longitudinal axis of the heat sink, the angled protrusions extending in a downward direction away from the lower surfaces of the plurality of fins to create a space between upper surfaces of the angled protrusions and the lower surfaces of the plurality of fins.

7. The method of claim 6, wherein a base width of the base is less than the fin width of the plurality of fins.

8. The method of claim 6, wherein outer edges of the angled protrusions are positioned between the sides of the base and sides of the fins.

9. The method of claim 6, further comprising:
    extruding the lower surface of the fins to form a contoured depression between overhangs, the overhangs being positioned on edges of the fins.

10. The method of claim 9, further comprising:
    positioning the base between the overhangs.

11. The method of claim 10, wherein the base includes a plurality of rows of vents orifices, the plurality of rows of vent orifices being offset from the central axis of the heat sink.

12. The method of claim 11, further comprising:
    coupling the base to the fins via a plurality of coupling orifices that are aligned with the central axis of the heat sink.

* * * * *